United States Patent
Ratchkov et al.

(10) Patent No.: US 6,835,972 B2
(45) Date of Patent: Dec. 28, 2004

(54) BOWTIE AND T-SHAPED STRUCTURES OF L-SHAPED MESH IMPLEMENTATION

(75) Inventors: Radoslav Ratchkov, Santa Clara, CA (US); Thomas Antisseril, Newark, CA (US); Hiroshi Ishikawa, Los Gatos, CA (US); Prasad Subbarao, San Jose, CA (US); Bo Shen, Fremont, CA (US); Ruben Molina, San Ramon, CA (US)

(73) Assignee: LSI Logic Corporation, Milpitas, CA (US)

( * ) Notice: Subject to any disclaimer, the term of this patent is extended or adjusted under 35 U.S.C. 154(b) by 0 days.

(21) Appl. No.: 10/434,715

(22) Filed: May 9, 2003

(65) Prior Publication Data

US 2004/0129955 A1 Jul. 8, 2004

Related U.S. Application Data

(60) Provisional application No. 60/439,063, filed on Jan. 3, 2003.

(51) Int. Cl.$^7$ ............................................... H01L 27/10
(52) U.S. Cl. ........................................ 257/207; 257/208
(58) Field of Search ................................ 257/207, 208, 257/211, 203, 209, 210, 758; 716/4

(56) References Cited

U.S. PATENT DOCUMENTS

| 5,311,058 | A |   | 5/1994  | Smolley      |         |
|-----------|---|---|---------|--------------|---------|
| 5,969,420 | A | * | 10/1999 | Kuge et al.  | 257/758 |
| 6,194,768 | B1|   | 2/2001  | Gardner et al.|        |
| 6,476,497 | B1|   | 11/2002 | Waldron et al.|        |
| 2003/0237059 | A1 | * | 12/2003 | Schultz   | 716/4 |

* cited by examiner

*Primary Examiner*—Steven Loke
(74) *Attorney, Agent, or Firm*—Trexler, Bushnell, Giangiorgi & Blackstone, Ltd.

(57) ABSTRACT

A multiple layer power mesh design includes an L-shaped structure and a bow tie-shaped structure. The L-shaped structure provides a plurality of L-shaped power rails in each of four quadrants of the layer. The bow tie-shaped structure includes plurality of vertical power rails in each of a left and right triangularly-shaped portion of the layer. The vertical power rails of the bow tie-shaped structure provide and interface between the upper and lower quadrants of the L-shaped layer. The bow tie-shaped structure provides additional available space which can, for example, be used for routing signal traces. A T-shaped structure is also provided for use with the bow tie-shaped layer. The T-shaped layer provides for improved distances between the VDD and the VSS power rails.

11 Claims, 3 Drawing Sheets

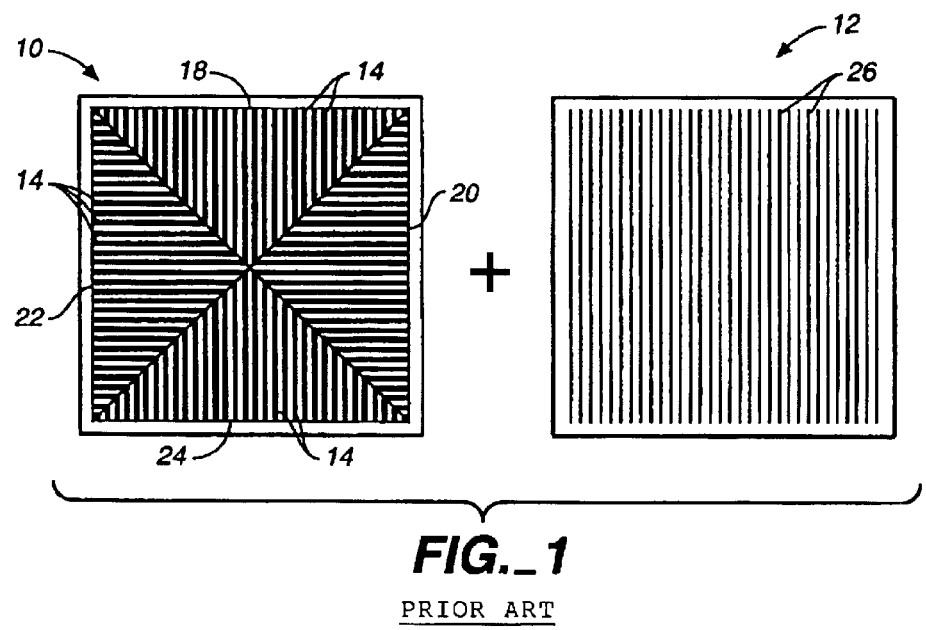
FIG._1
PRIOR ART
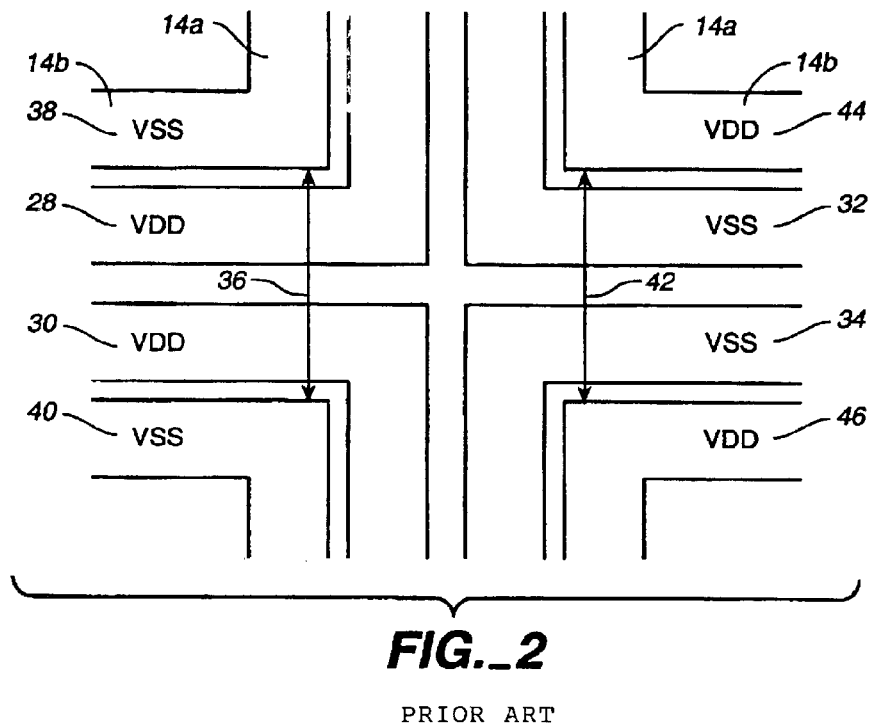
FIG._2
PRIOR ART

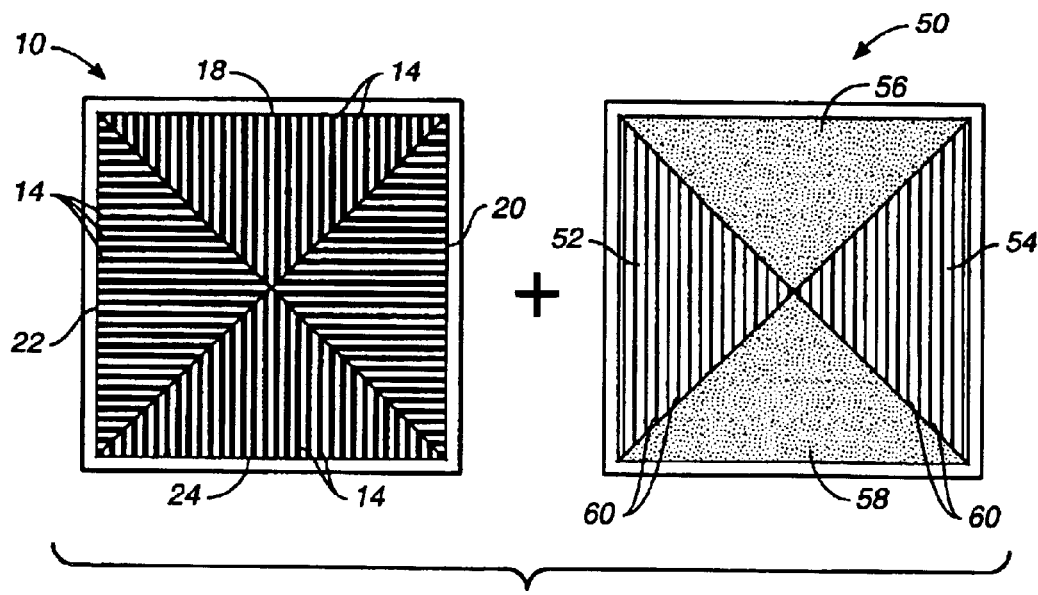
FIG._3
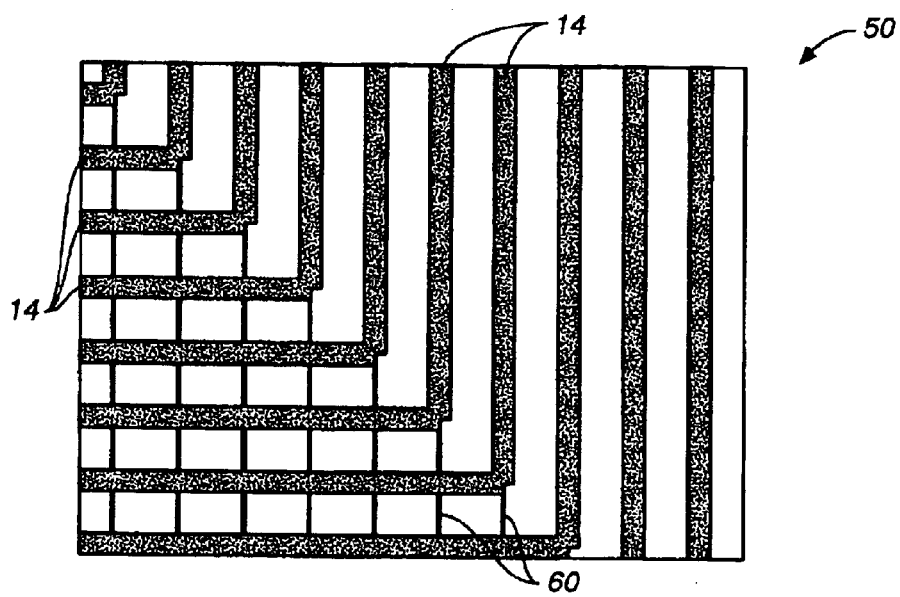
FIG._4

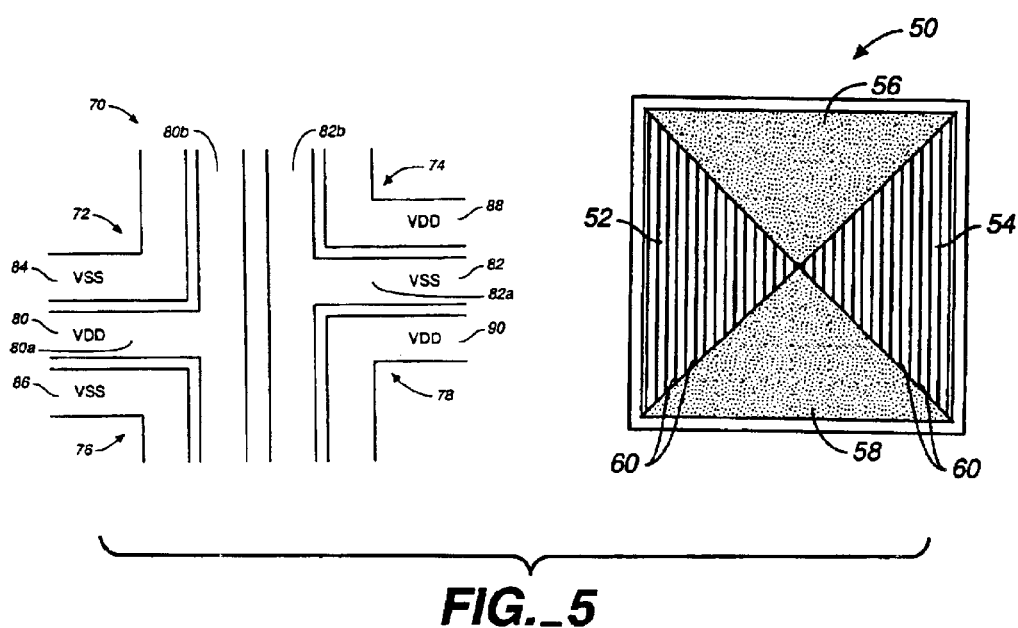
FIG._5

BOWTIE AND T-SHAPED STRUCTURES OF L-SHAPED MESH IMPLEMENTATION

RELATED APPLICATION (PRIORITY CLAIM)

This application claims the benefit of U.S. Provisional Application Ser. No. 60/439,063, filed Jan. 3, 2003.

BACKGROUND

The present invention generally relates to power mesh schemes for a wire bond package. More specifically, the invention relates to a new mesh structure to support an L-shaped mesh structure and a T-shaped mesh structure which is an improvement to the L-shaped mesh structure.

As shown in FIG. 1, an L-shaped mesh structure 10 is used in connection with a vertical mesh structure 12. The L-shaped mesh structure 10 includes L-shaped power rails 14 arranged in quadrants of the mesh structure 10. An upper left quadrant 18, a upper right quadrant 20, a lower left quadrant 22, and a lower right quadrant 24 comprise the quadrants of the L-shaped mesh structure 10. Each L-shaped power rail 14 includes a vertical portion 14a and a horizontal portion 14b. This L-shaped mesh structure 10 realizes symmetrical current distributions even though only one layer is available for power distribution. To power the horizontal power rails, however, vertical trunks traversing the length of the die need to be inserted at a fixed pitch. Thus, the vertical mesh 12 which includes vertical power rails 26 is used in connection with the L-shaped mesh structure 10.

The center region of the L-shaped mesh structure is shown in FIG. 2. As shown in FIG. 2, an inner most VDD rail 28 positioned in the upper left quadrant 18 lies proximate to an inner most VDD rail 32 positioned in the lower left quadrant 22. Also an inner most VSS rail 30 positioned in the upper right quadrant 20 lies proximate an inner most VSS rail 34 positioned in the lower right quadrant 24. As a result, the distance, represented by the arrow 36, between the inner most VSS rail 38 of the upper left quadrant 18 and the inner most VSS rail 40 of the lower left quadrant 22, exceeds 200 $\mu$m. Likewise, the distance, represented by the arrow 42, between the inner most VDD rail 44 of the upper right quadrant 20 and the inner most VDD rail 46 of the lower right quadrant 24, exceeds 200 $\mu$m. These large distances will result in EM violations unless the number of vias is increased. Increasing the number of vias, however, is not a desired approach because it results in the sacrifice of area.

OBJECTS AND SUMMARY

A general object of an embodiment of the present invention is to provide a power mesh design which includes a bow tie shaped mesh.

Another object of the present invention is to reduce the number of vias which extend from the mesh structure.

Yet another object of the present invention is to increase the routing area available on the structure.

Still another object of the present invention is to provide a mesh design which includes a T-shaped mesh.

Briefly, and in accordance with at least one of the foregoing objects, an embodiment of the present invention provides a bow tie shaped mesh for use in connection with an L-shaped mesh. The present invention also provides a T-shaped power mesh structure which provides advantages over the L-shaped power mesh structure.

BRIEF DESCRIPTION OF THE DRAWINGS

The organization and manner of the structure and operation of the invention, together with further objects and advantages thereof, may best be understood by reference to the following description, taken in connection with the accompanying drawing, wherein:

FIG. 1 schematically illustrates a multiple layer power mesh design, where the design includes an L-shaped power mesh structure and a full vertical mesh structure;

FIG. 2 schematically illustrates the center portion of an L-shaped mesh structure;

FIG. 3 schematically illustrates a multiple layer power mesh design which is in accordance with an embodiment of the present invention, where the design includes an L-shaped mesh structure and a bow tie-shaped mesh structure;

FIG. 4 illustrates a portion of the L-shaped and bow tie-shaped mesh structures and schematically illustrates the connection between the L-shaped and bow tie-shaped mesh structures of FIG. 3; and FIG. 5 schematically illustrates the center portion of a T-shaped mesh structure in accordance with an embodiment of the present invention.

DESCRIPTION

While the invention may be susceptible to embodiment in different forms, there are shown in the drawings, and herein will be described in detail, specific embodiments with the understanding that the present disclosure is to be considered an exemplification of the principles of the invention, and is not intended to limit the invention to that as illustrated and described herein.

FIG. 3 illustrates a multiple layer power mesh design which is in accordance with an embodiment of the present invention and provides an L-shaped mesh structure 10, identical to the L-shaped mesh structure of FIG. 1, and a bow tie-shaped mesh structure 50. The bow tie-shaped mesh structure 50 includes a left triangularly-shaped power area 52 and a right triangularly shaped power area 54. The bow tie-shaped mesh structure 50 also includes an upper triangularly shaped open area 56 and a lower triangularly shaped open area 58. Vertical power rails 60 are provided in each of the areas 52, 54. The bow tie-shaped structure replaces the full vertical mesh structure 12 of FIG. 1. No power rails are provided in the open areas 56, 58, therefore, additional space is available for routing. Therefore, the bow tie-shaped mesh allows the power mesh to be reduced without sacrificing power performance.

The interface between the L-shaped mesh structure 10 and the bow tie-shaped structure 50 is shown in FIG. 4. The bow tie-shaped structure 50 provides an interface between the upper left and upper right quadrants 18, 20 of the L-shaped mesh structure 10 and the lower left and lower right quadrants 22, 24 of the L-shaped mesh structure 10. The bow tie-shaped structure 50 provides a vertical mesh which is available across the entire die. Stack vias (not shown) are dropped from the bow tie-shaped structure 50 to M1 STD-CELL power rail at regular intervals.

Benchmark test results indicate that the power performance of the bow-tie shaped structure 50 and the full vertical mesh 12 are very similar. In addition, the IR drop is increased by only 80 $\mu$V with the bow tie-shaped structure 50. At the same time, however, routing resources can be increased by about 5.8%, due to the increased routing space provided by open areas 56, 58. Finally the bow tie-shaped structure 50 is used as a power mesh scheme of the wire bond designs with one thick metal layer.

Alternatively, rather than using the L-shaped mesh structure 10 shown in FIG. 1–4 in connection with the bow tie-shaped structure 50, a T-shaped mesh structure 70 can be used in accordance with an embodiment of the present invention. The center portion of the T-shaped structure is shown in FIG. 5. The T-shaped structure 70 includes an upper left quadrant 72, an upper right quadrant 74, a lower left quadrant 76, a lower right quadrant 78, a first T-shaped rail 80 and a second T-shaped rail 82. L-shaped rails are provided in each of the quadrants 72, 74, 76, 78. The first T-shaped rail 80 is designated a VDD rail and includes a horizontal portion 80a and a vertical portion 80b. The second T-shaped rail 82 is designated a VSS rail and includes a horizontal portion 82a and a vertical portion 82b. The horizontal portion 80a of the T-shaped rail 80 is provided between the upper left quadrant 72 and the lower left quadrant 76. The vertical portion 80b of the T-shaped rail 80 is provided between the left upper and lower quadrants 72, 76 and the vertical portion 82b of the T-shaped rail 82. The horizontal portion 82a of the T-shaped rail 82 is provided between the upper right quadrant 74 and the lower right quadrant 78. The vertical portion 82b of the T-shaped rail 82 is provided between the right upper and lower quadrants 74, 78 and the vertical portion 80b of the T-shaped rail 80.

An L-shaped VSS rail 84 is provided immediately proximate the T-shaped rail 80 in the upper left quadrant 72. An L-shaped VSS rail 86 is provided immediately proximate the T-shaped rail 80 in the lower left quadrant 76. An L-shaped VDD rail 88 is provided immediately proximate the T-shaped rail 82 in the upper right quadrant 74. An L-shaped VDD rail 90 is provided immediately proximate the T-shaped rail 82 in the lower right quadrant 78.

In the design provided by the T-shaped mesh structure 70, a VDD rail is always adjacent a VSS rail. By using the T-shaped mesh structure 70, electro-magnetic problems can be avoided without the need to increase the number of vias. In addition, a shift is effectively provided within the design of the T-shaped mesh structure 70. As a result of the shift, effectively continuous VSS and VDD rails are provided in the horizontal direction. For example, the T-shaped rail 80 is shifted such that the horizontal portion 80a of the rail 80 is aligned with the horizontal portion of the L-shaped rail 90 in the lower right quadrant 78. Also, the T-shaped rail 82 is shifted such that the horizontal portion 82a of the rail 82 is aligned with the horizontal portion of the L-shaped rail 84 in the upper left quadrant 72. As a result of the effectively continuous VDD and VSS rails, the integration of CoreWare with top strap pins into designs utilizing this type of power mesh structure is easy. Finally, the T-shaped structure is useable as a power mesh scheme of the GFLX wire bond designs with one thick metal layer.

While embodiments of the present invention are shown and described, it is envisioned that those skilled in the art may devise various modifications of the present invention without departing from the spirit and scope of the appended claims.

What is claimed is:

1. A multiple layer power mesh design comprising an L-shaped mesh structure; and a bow tie-shaped mesh structure, said bow tie-shaped mesh structure being disposed adjacent to said L-shaped mesh structure on separate layers.

2. A multiple layer power mesh design as recited in claim 1, wherein said L-shaped mesh structure includes an upper left quadrant, an upper right quadrant, a lower left quadrant and a lower right quadrant and wherein a plurality of L-shaped rails are positioned within each said quadrant.

3. A multiple layer power mesh design as recited in claim 2, wherein a plurality of vertical rails of said bow tie-shaped structure provides an interface between said upper right and lower right quadrants of said L-shaped mesh structure and an interface between said upper left and lower left quadrants of said L-shaped mesh structure.

4. A multiple layer power mesh design as recited in claim 1, wherein said bow tie-shaped mesh layer includes a left triangular portion and a right triangular portion and wherein a plurality of vertical rails are provided in said left and right triangular portions.

5. A multiple layer power mesh design as recited in claim 1, wherein said bow tie-shaped structure includes an upper triangularly-shaped open portion and a lower triangularly-shaped open portion.

6. A multiple layer power mesh design as recited in claim 5, wherein said upper triangulary-shaped open portion and said lower triangularly-shaped open portion are available for routing signal traces.

7. A multiple layer power mesh design comprising a T-shaped mesh structure wherein said T-shaped mesh structure includes:

an upper left quadrant, an upper right quadrant, a lower left quadrant, a lower right quadrant, a first T-shaped power rail, and a second T-shaped power rail, each said T-shaped power rail including a horizontal portion and a vertical portion;

wherein said horizontal portion of said first T-shaped power rail lies between said upper left quadrant and said lower left quadrant; wherein said vertical portion of said first T-shaped power rail lies between said upper left quadrant and said lower left quadrant and said vertical portion of said second T-shaped power rail; and wherein said horizontal portion of said second T-shaped power rail lies between said upper right quadrant and said lower right quadrant; wherein said vertical portion of said second T-shaped power rail is lies between said upper right quadrant and said lower right quadrant and said vertical portion of said first power rail;

further including a plurality of L-shaped power rails in each of said quadrants, each of said plurality of L-shaped power rails including a horizontal portion and a vertical portion.

8. A multiple layer power mesh design as defined in claim 7, wherein said first T-shaped rail is designated a VDD power rail and said second T-shaped rail is designated a VSS power rail.

9. A multiple layer power mesh design as defined in claim 8, wherein said horizontal portion of said first T-shaped power rail is aligned with a horizontal portion of a VDD designated L-shaped power rail and wherein said horizontal portion of said second T-shaped power rail is aligned with a horizontal portion of a VSS designated L-shaped power rail.

10. A multiple layer power mesh design as defined in claim 7, wherein a number of said plurality of L-shaped power rails are designated VSS power rails and a number of said plurality of L-shaped power rails are designated VDD power rails; wherein horizontal portions of said VSS power rails from said upper left quadrant and said lower left quadrant are aligned with said horizontal portions of said VDD power rails from said upper right quadrant and said lower right quadrant.

11. A multiple layer power mesh design as defined in claim 7, further including a bow tie-shaped mesh structure, said bow tie-shaped mesh structure being disposed adjacent to said T-shaped mesh structure.

* * * * *